(12) United States Patent
Xi

(10) Patent No.: US 11,942,432 B2
(45) Date of Patent: Mar. 26, 2024

(54) METHOD FOR PACKAGING COF

(71) Applicant: CHIPMORE TECHNOLOGY CORPORATION LIMITED, Suzhou (CN)

(72) Inventor: Yaoxin Xi, Suzhou (CN)

(73) Assignee: CHIPMORE TECHNOLOGY CORPORATION LIMITED, Suzhou (CN)

( * ) Notice: Subject to any disclaimer, the term of this patent is extended or adjusted under 35 U.S.C. 154(b) by 331 days.

(21) Appl. No.: 17/615,797

(22) PCT Filed: Oct. 13, 2020

(86) PCT No.: PCT/CN2020/120535
§ 371 (c)(1),
(2) Date: Dec. 1, 2021

(87) PCT Pub. No.: WO2021/082898
PCT Pub. Date: May 6, 2021

(65) Prior Publication Data
US 2022/0319997 A1 Oct. 6, 2022

(30) Foreign Application Priority Data
Oct. 29, 2019 (CN) .......................... 201911038471.0

(51) Int. Cl.
*H01L 23/538* (2006.01)
*H01L 23/498* (2006.01)

(52) U.S. Cl.
CPC ...... *H01L 23/5387* (2013.01); *H01L 23/4985* (2013.01)

(58) Field of Classification Search
CPC .................................................. H01L 23/5387
USPC ............................................................ 257/685
See application file for complete search history.

(56) References Cited

U.S. PATENT DOCUMENTS

| | | | |
|---|---|---|---|
| 2006/0055021 A1* | 3/2006 | Yamamoto | H01L 23/4985 257/E21.503 |
| 2018/0114769 A1* | 4/2018 | Chang | H01L 24/32 |

FOREIGN PATENT DOCUMENTS

| | | |
|---|---|---|
| CN | 1921100 A | 2/2007 |
| CN | 104517924 A | 4/2015 |
| CN | 107424966 A | 12/2017 |
| CN | 107978582 A | 5/2018 |

(Continued)

Primary Examiner — Ajay Arora
(74) Attorney, Agent, or Firm — Cheng-Ju Chiang

(57) ABSTRACT

The present invention discloses a method for packaging a chip-on-film (COF). The method includes: S1, forming a plurality of first pins on a circuit surface of a flexible circuit substrate, and forming a plurality of second pins on a chip to be packaged; S2, arranging to keep the circuit surface always facing downwards, arranging to keep a surface of the chip to be packaged, where the second pins matching the first pins are arranged, always facing upwards, and arranging the first pins and the second pins, to be opposite to each other; and S3, applying a top-down pressure to the flexible circuit substrate, and/or applying a bottom-up pressure to the chip to be packaged, and simultaneously heating at high temperature to solder the first pins and the second pins in a fused eutectic manner. The method of the present invention improves the product yield and stability.

10 Claims, 2 Drawing Sheets

(56) References Cited

FOREIGN PATENT DOCUMENTS

| CN | 110739238 A | 1/2020 |
|---|---|---|
| JP | 2009-277987 A | 11/2009 |

* cited by examiner

METHOD FOR PACKAGING COF

CROSS-REFERENCE TO RELATED APPLICATION

This application claims priority to Chinese Patent Application No. 201911038471.0, filed on Oct. 29, 2019 and entitled "METHOD FOR PACKAGING COF", the disclosure of which is herein incorporated by reference in its entirety.

TECHNICAL FIELD

The present invention relates to the field of semiconductor manufacturing, and in particular, relates to a method for packaging a COF.

BACKGROUND

With the increasing density of integrated circuits, chip packaging technologies have become more and more diversified. Due to advantages such as reduced chip package size and shortened signal transmission paths, a flip-chip interconnect technology (FC) has been widely used in the field of chip packaging.

The flip-chip interconnect technology is to bond a bare die, with a surface facing down, to a substrate. A specific process is as follows: a plurality of bumps is formed on the surface of the chip, and are electrically and mechanically connected to circuits on the circuit substrate by thermo-compression bonding and other techniques, and then the chip can be electrically connected to an external electronic device via inner circuits of the circuit substrate.

In the field of the circuit packaging of liquid crystal displays, tape-type chip-on-film (COF) packaging is used more commonly at present. This COF packaging technology takes a flexible circuit substrate as a carrier for a chip to be packaged, i.e., as the above circuit substrate, and then the bumps on the chip are bonded to inner pins of the flexible circuit substrate by the thermo-compression bonding technique.

In the prior art, in the process of bonding the bumps on the chip to the inner pins of the flexible circuit substrate, the pins of the flexible circuit substrate face upwards, and the bumps of the chip face downwards; the chip is moved directly above the flexible circuit substrate under the adsorption of a thermo-compression head; and then, the thermo-compression head heats and applies a pressure to the chip, such that the bumps on the chip and the inner pins of the flexible circuit substrate are soldered.

During the process of this packaging method, since the thermo-compression head mechanism is composed of many metal conveying mechanisms, a lot of metallic and non-metallic particles would be produced due to frictions between metal mechanisms and between wires during the movement of the thermo-compression head. There is a high probability for these particles to fall on and between the pins of the flexible circuit substrate. In such a way, after the bumps and the pins are soldered, these particles may cause poor pin contact or inter-pin shorting, leading to poor electrical properties of the chip. Further, some particles are fine and tiny and thus may be probably undetected by general electrical tests. When such a product is combined with a display screen and then undergoes some twists or influences of ambient temperature and humidity, the metallic particles would eventually cause short circuits between the pins, non-metallic halogen particles would eventually cause metal migration and short circuits, or the particles on the pins cause insufficient bonding strength and disconnection. As a result, great losses would be caused.

SUMMARY

An object of the present invention is to provide a method for packaging a COF for solving the technical problems described above.

To achieve the above object of the present invention, an embodiment of the present invention provides a method for packaging a COF. The method includes: S1, providing a flexible circuit substrate to be packaged and forming a plurality of first pins on a circuit surface of the flexible circuit substrate, and providing a chip to be packaged and forming a plurality of second pins on the chip to be packaged;

S2, arranging to keep the circuit surface of the flexible circuit substrate always facing downwards, arranging to keep a surface of the chip to be packaged, where the second pins matching the first pins are arranged, always facing upwards, and arranging the first pins on the flexible circuit substrate and the second pins on the chip to be packaged, both of which are matched with each other, to be opposite to each other; and S3, applying a top-down pressure to the flexible circuit substrate and/or applying a bottom-up pressure to the chip to be packaged, and simultaneously heating at high temperature to solder the first pins and the second pins in a fused eutectic manner.

As a further improvement to an embodiment of the present invention, S3 specifically includes:

keeping a position of the flexible circuit substrate fixed, applying the bottom-up pressure to the chip to be packaged, and simultaneously heating the chip to be packaged at high temperature to solder the first pins and the second pins in the fused eutectic manner.

As a further improvement to an embodiment of the present invention, the method further includes: providing a thermo-compression head that is disposed below the chip to be packaged, and arranging an adsorption surface of the thermo-compression head to face upwards; adsorbing a surface of the chip to be packaged, where the second pins are not arranged, by the adsorption surface of the thermo-compression head; and driving the thermo-compression head to move so as to provide the bottom-up pressure to the chip to be packaged, and simultaneously heating the chip to be packaged at high temperature.

As a further improvement to an embodiment of the present invention, after S3, the method further includes: releasing an adsorption force of the adsorption surface to separate and remove the thermo-compression head from the chip to be packaged.

As a further improvement to an embodiment of the present invention, the method further includes: providing a base platform that is disposed above the flexible circuit substrate, and fixing a surface of the flexible circuit substrate, where the first pins are not arranged, on the base platform.

As a further improvement to an embodiment of the present invention, the base platform is made of a transparent material resistant to high temperature.

As a further improvement to an embodiment of the present invention, the base platform is made of a quartz material.

As a further improvement to an embodiment of the present invention, the method further includes: providing a charge coupled device (CCD) imaging device that is disposed above the base platform.

As a further improvement to an embodiment of the present invention, S2 further includes: seeing through the flexible circuit substrate by the CCD imaging device; monitoring if the first pins on the flexible circuit substrate are arranged opposite to the second pins on the chip to be packaged; if so, proceeding to the next step; and if not, adjusting the flexible circuit substrate and/or the chip to be packaged, and proceeding to the next step when the first pins and the second pins are arranged opposite to each other.

As a further improvement to an embodiment of the present invention, after S3, the method further includes: performing plastic packaging between the flexible circuit substrate and the chip to be packaged to form a semi-package; and cutting the semi-package to form a singulated COE package structure.

Compared with the prior art, the method for packaging the COF according to the present invention implements the packaging after exchanging the positions of and flipping the flexible circuit substrate and the chip to be packaged, which can prevent particles generated during the movement of a device above the flexible circuit substrate from falling on and/or between the pins of the flexible circuit substrate during the packaging process, thereby improving the product yield and stability.

DETAILED DESCRIPTION

The present invention will be described in detail below with reference to the specific embodiments shown in the accompanying drawings. However, these embodiments are not intended to limit the present invention, and changes in structures, methods or functions, made by a person of ordinary skill in the art according to these embodiments, are all included within the scope of protection of the present invention.

It should be noted that positional terms as used herein refer to absolute spatial positions. That is, "up" means "upper" or "above", and "down" means "lower" or "below", which are not interchangeable in their spatial positions. The terms for absolute spatial positions refer to orientations shown in the figures during use or work, and in practical applications, the structure cannot be flipped or is not interchangeable in position.

Figure 1:
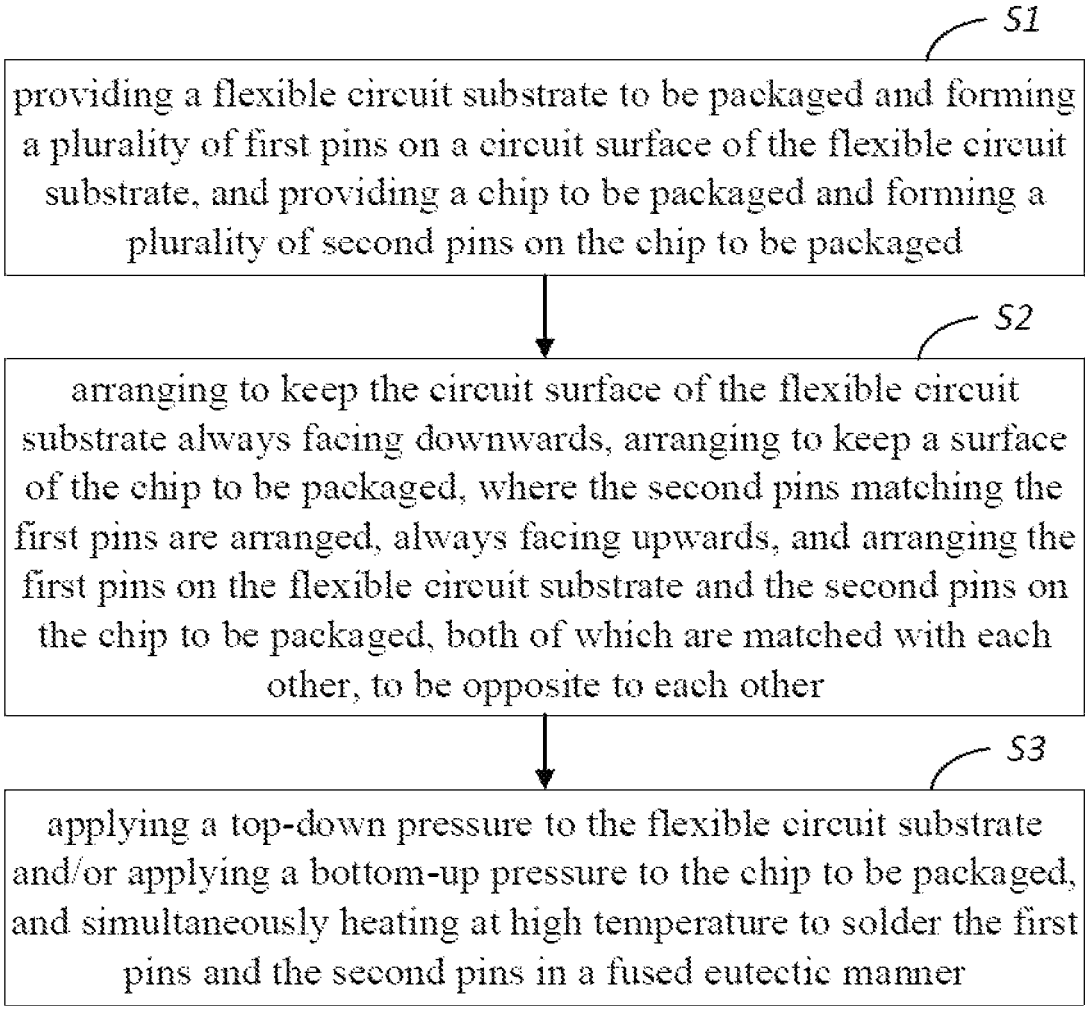
FIG. 1 is a schematic flowchart of a method for packaging a COF according to an embodiment of the present invention.
Figure 2:
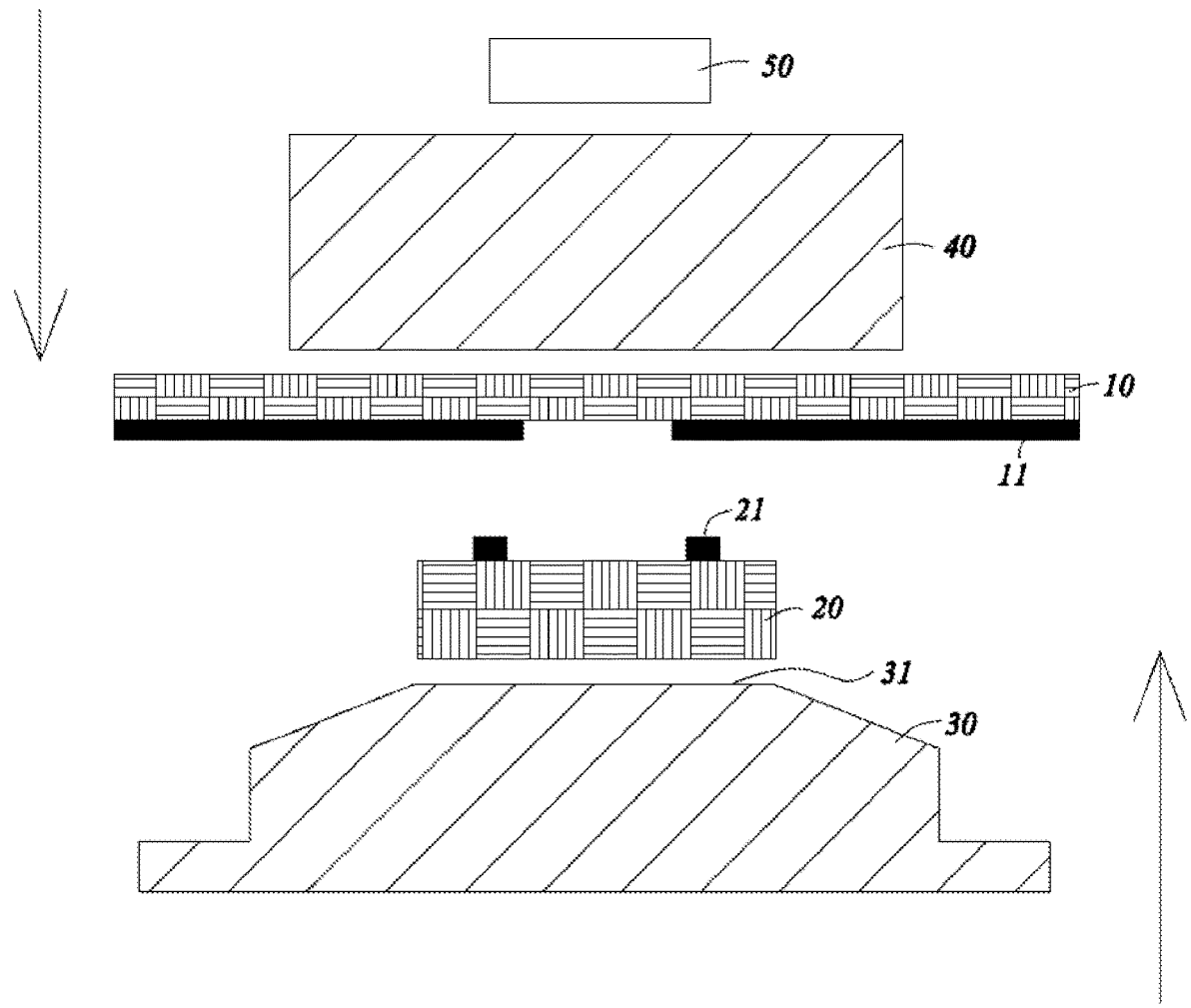
FIG. 2 is a schematic diagram of COF packaging according to the present invention.

In combination with those shown in FIG. 1 and FIG. 2, an embodiment of the present invention provides a method for packaging a COF. The method includes:

S1, providing a flexible circuit substrate 10 to be packaged and forming a plurality of first pins 11 on a circuit surface of the flexible circuit substrate 10, and providing a chip 20 to be packaged and forming a plurality of second pins 21 on the chip 20 to be packaged;

S2, arranging to keep the circuit surface of the flexible circuit substrate 10 always facing downwards, arranging to keep a surface of the chip 20 to be packaged, where the second pins 21 matching the first pins 11 are arranged, always facing upwards, and arranging the first pins 11 on the flexible circuit substrate 10 and the second pins 21 on the chip 20 to be packaged, both of which are matched with each other, to be opposite to each other; and S3, applying a top-down pressure to the flexible circuit substrate 10 and/or applying a bottom-up pressure to the chip 20 to be packaged, and simultaneously heating at high temperature to solder the first pins 11 and the second pins 21 in a fused eutectic manner.

Further, after S3, the method further includes: performing plastic packaging between the flexible circuit substrate 10 and the chip 20 to be packaged to form a semi-package; and cutting the semi-package to form a singulated COF package structure.

In an implementable mode of the present invention, the first pins 11 are typically made of Cu (copper) with their surfaces plated with tin; the second pins 21 are typically made of Au (gold). In such a way, after the first pins 11 and the second pins 21 are abutted against each other and undergo high temperature, the tin in the first pins 11 and the gold in the second pins 21 are fused to form a eutectic at high temperature, thereby bonding the flexible circuit substrate 10 to the chip 20 to be packaged.

For S2, on the basis of the prior art, the positions of the flexible circuit substrate 10 and the chip 20 to be packaged are exchanged and flipped, so as to keep the first pins 11 always facing downwards during the packaging process, and the second pins 21 always facing upwards.

In a specific application process, since the flexible circuit substrate 10 typically covers the chip 20 to be packaged, when the flexible circuit substrate 10 is disposed above the chip 20 to be packaged, the particles generated during the movement of the device above the chip 20 to be packaged will not fall on or between the first pins 11. That is, a position and type of a device that drives both of the components to move will not affect a packaging result.

In a preferred embodiment of the present invention, S3 specifically includes: keeping a position of the flexible circuit substrate 10 fixed, applying the bottom-up pressure to the chip 20 to be packaged, and simultaneously heating the chip 20 to be packaged at high temperature to solder the first pins 11 and the second pins 21 in a fused eutectic manner.

In a specific embodiment of the present invention, a thermo-compression head 30 that is disposed below the chip 20 to be packaged is provided, and an adsorption surface 31 of the thermo-compression head 30 is arranged to face upwards; a surface of the chip 20 to be packaged, where the second pins 21 are not arranged, is adsorbed by the adsorption surface 31 of the thermo-compression head 30; and the thermo-compression head 30 is driven to move so as to provide the bottom-up pressure to the chip 20 to be packaged, and simultaneously the chip 20 to be packaged is heated at high temperature.

The thermo-compression head 30 is a known device in the technical field, and its working principle and specific structure will not be further described here. It should be noted that in order to match the position of the chip 20 to be packaged, the thermo-compression head 30 in this specific embodiment is arranged below the chip 20 to be packaged in this specific embodiment of the present invention, and meanwhile, an adsorption surface 31 of the thermo-compression head 30 needs to be arranged to face upwards, so as to match the adsorption of the surface of the chip 20 to be packaged, where the second pins 21 are not arranged.

Further, when the thermo-compression head 30 is utilized to transfer the chip 20 to be packaged, to provide a pressure to the chip 20 to be packaged and to raise the temperature of the chip 20 to be packaged, after S3, the method further includes: releasing an adsorption force of the adsorption surface 31 to separate and remove the thermo-compression head 30 from the chip 20 to be packaged.

With the above structure, the thermo-compression head 30, when moving, is disposed below the chip 20 to be packaged, such that the particles generated during the movement of the thermo-compression head 30 can be further prevented from falling on or between the first pins 11.

In a specific embodiment of the present invention, the method further includes: providing a base platform 40 that is disposed above the flexible circuit substrate 10, and fixing a surface of the flexible circuit substrate 10, where the first pins 11 are not arranged, on the base platform 40.

During the specific implementation of the present invention, the base platform 40 likewise fixes the flexible circuit substrate 10 by means of vacuum adsorption, which will not be further described here.

Preferably, in the traditional process, the base platform 40 is typically made of metal or ceramic, and is opaque on the whole. In such a way, the pin deviation between the flexible circuit substrate 10 and the chip 20 to be packaged cannot be monitored during their bonding process. Accordingly, the deviation between the pins during the thermal bonding can be viewed through an imaging system only after the flexible circuit substrate 10 and the chip 20 to be packaged are subjected to press fit and then conveyed out of a press-fit region, resulting in lagged timeliness and increased defect rate caused by deviation-induced shorting.

Accordingly, in a preferred embodiment of the present invention, the material of the base platform 40 is changed, and a base platform 40 made of a transparent material resistant to high temperature, such as a quartz material, is then provided.

Further, the method further includes: providing a charge coupled device (CCD) imaging device that is disposed above the base platform 40; seeing through the flexible circuit substrate 10 by the CCD imaging device 50; monitoring if the first pins 11 on the flexible circuit substrate 10 are arranged opposite to the second pins 21 on the chip 20 to be packaged; if so, proceeding to the next step; and if not, adjusting the flexible circuit substrate 10 and/or the chip 20 to be packaged, and proceeding to the next step when the first pins 11 and the second pins 21 are arranged opposite to each other.

In summary, the method for packaging the COF according to the present invention implements the packaging after exchanging the positions of and flipping the flexible circuit substrate and the chip to be packaged, which can prevent the particles, generated during the movement of the devices above the flexible circuit substrate, from falling on and/or between the pins of the flexible circuit substrate during the packaging process, thereby improving the product yield and stability. In addition, with the change of the material for the base platform, the position of the flexible circuit substrate relative to the chip to be packaged can be visually monitored during the thermal bonding process. Further, by additionally installing the CCD imaging device on the base platform side, whether the flexible circuit substrate deviates relative to the chip to be packaged can be automatically visually monitored during the thermal bonding process, thereby improving the packaging quality of the product and save resources.

It should be understood that although the Description is described according to the embodiments, not every embodiment includes only one independent technical solution. This presentation manner of the Description is only for clarity. A person skilled in the art should consider the Description as a whole, and technical solutions in all of the embodiments may also be properly combined to form other embodiments that will be understood by a person skilled in the art.

The above detailed description only aims to specifically illustrate the feasible embodiments of the present invention, and is not intended to limit the scope of protection of the present invention. Equivalent embodiments or modifications thereof made without departing from the spirit of the present invention shall fall within the scope of protection of the present invention.

What is claimed is:

1. A method for packaging a COF, comprising:
    S1, providing a flexible circuit substrate to be packaged and forming a plurality of first pins on a circuit surface of the flexible circuit substrate, and providing a chip to be packaged and forming a plurality of second pins on the chip to be packaged;
    S2, arranging to keep the circuit surface of the flexible circuit substrate always facing downwards, arranging to keep a surface of the chip to be packaged, where the second pins matching the first pins are arranged, always facing upwards, and arranging the first pins on the flexible circuit substrate and the second pins on the chip to be packaged, both of which are matched with each other, to be opposite to each other; and
    S3, applying a top-down pressure to the flexible circuit substrate and/or applying a bottom-up pressure to the chip to be packaged, and simultaneously heating at high temperature to solder the first pins and the second pins in a fused eutectic manner.

2. The method for packaging the COF according to claim 1, wherein S3 specifically comprises:
    keeping a position of the flexible circuit substrate fixed, applying the bottom-up pressure to the chip to be packaged, and simultaneously heating the chip to be packaged at high temperature to solder the first pins and the second pins in the fused eutectic manner.

3. The method for packaging the COF according to claim 2, further comprising:
    providing a thermo-compression head that is disposed below the chip to be packaged, and arranging an adsorption surface of the thermo-compression head to face upwards;
    adsorbing a surface of the chip to be packaged, where the second pins are not arranged, by the adsorption surface of the thermo-compression head; and
    driving the thermo-compression head to move so as to provide the bottom-up pressure to the chip to be packaged, and simultaneously heating the chip to be packaged at high temperature.

4. The method for packaging the COF according to claim 3, wherein after S3, the method further comprises: releasing an adsorption force of the adsorption surface to separate and remove the thermo-compression head from the chip to be packaged.

5. The method for packaging the COF according to claim 1, further comprising: providing a base platform that is disposed above the flexible circuit substrate, and fixing a surface of the flexible circuit substrate, where the first pins are not arranged, on the base platform.

6. The method for packaging the COF according to claim 5, wherein the base platform is made of a transparent material resistant to high temperature.

7. The method for packaging the COF according to claim 6, wherein the base platform is made of a quartz material.

8. The method for packaging the COF according to claim 5, further comprising: providing a CCD imaging device that is disposed above the base platform.

9. The method for packaging the COF according to claim 8, wherein S2 further comprises: seeing through the flexible circuit substrate by the CCD imaging device; monitoring if the first pins on the flexible circuit substrate are arranged opposite to the second pins on the chip to be packaged; if so, proceeding to the next step; and if not, adjusting the flexible circuit substrate and/or the chip to be packaged, and proceeding to the next step when the first pins and the second pins are arranged opposite to each other.

10. The method for packaging the COF according to claim 1, wherein after S3, the method further comprises: performing plastic packaging between the flexible circuit substrate and the chip to be packaged to form a semi-package; and cutting the semi-package to form a singulated COF package structure.

* * * * *